(12) United States Patent
Sahu et al.

(10) Patent No.: US 12,306,662 B2
(45) Date of Patent: May 20, 2025

(54) INTEGRATED CIRCUIT FOR CLOCK GENERATION

(71) Applicant: NXP B.V., Eindhoven (NL)

(72) Inventors: Siyaram Sahu, Bari Raisen (IN); Anand Kumar Sinha, Noida (IN); Krishna Thakur, GautamBudh Nagar (IN)

(73) Assignee: NXP B.V., Eindhoven (NL)

( * ) Notice: Subject to any disclaimer, the term of this patent is extended or adjusted under 35 U.S.C. 154(b) by 109 days.

(21) Appl. No.: 18/485,562

(22) Filed: Oct. 12, 2023

(65) Prior Publication Data

US 2024/0377855 A1 Nov. 14, 2024

(30) Foreign Application Priority Data

May 11, 2023 (IN) .............................. 202311033343

(51) Int. Cl.
*G06F 1/10* (2006.01)
*G06F 1/08* (2006.01)

(52) U.S. Cl.
CPC . *G06F 1/10* (2013.01); *G06F 1/08* (2013.01)

(58) Field of Classification Search
CPC .................................... G06F 1/10; G06F 1/08
See application file for complete search history.

(56) References Cited

U.S. PATENT DOCUMENTS

| 6,686,773 | B1 | 2/2004 | Dash et al. |
| 6,894,542 | B2 | 5/2005 | Prexl et al. |
| 10,819,279 | B1 | 10/2020 | Monsalve et al. |
| 11,502,657 | B2 | 11/2022 | Shen et al. |
| 2007/0290730 | A1 | 12/2007 | Dai et al. |
| 2008/0100390 | A1 | 5/2008 | Novac |
| 2008/0258795 | A1 | 10/2008 | Prexl et al. |

(Continued)

FOREIGN PATENT DOCUMENTS

FR 2808940 A1 11/2001

OTHER PUBLICATIONS

Cheng, et al; "The Charge-Transfer Feedback-Controlled Split-Path CMOS Buffer," IEEE Transactions on Circuits and Systems—II: Analog and Digital Signal Processing, vol. 46, No. 3, Mar. 1999, pp. 346-348.

(Continued)

*Primary Examiner* — Phil K Nguyen
(74) *Attorney, Agent, or Firm* — Joanna G. Geld

(57) ABSTRACT

A clock generator includes a buffer stage to drive an output clock and a slew accelerator circuit to receive a first clock signal and generate an input clock signal to the buffer stage. The slew accelerator circuit includes first, second, and third inverter stages. The first stage generates a pair of non-overlapping clock signals from the first clock signal. A rise time of a first non-overlapping clock signal of the pair is faster than a rise time of a second non-overlapping clock signal of the pair, and a fall time of the second non-overlapping clock signal is faster than a fall time of the first non-overlapping clock signal. The second stage generates a first intermediate clock signal based on the pair of non-overlapping clock signals. The third stage generates the input clock signal to the buffer stage based on the first intermediate clock signal and the pair of non-overlapping clocks.

20 Claims, 4 Drawing Sheets

(56) References Cited

U.S. PATENT DOCUMENTS

| | | | | |
|---|---|---|---|---|
| 2019/0214983 A1* | 7/2019 | Luo | ................. | H03K 17/063 |
| 2019/0253042 A1* | 8/2019 | Yang | ................. | H03K 5/1515 |
| 2022/0294433 A1* | 9/2022 | Dai | ................. | H03K 3/356191 |
| 2022/0400036 A1* | 12/2022 | Ko | ................. | H03K 3/037 |
| 2023/0223054 A1* | 7/2023 | Li | ................. | G11C 19/287 |
| | | | | 365/100 |
| 2023/0396240 A1* | 12/2023 | Likens | ................. | H03K 5/15013 |

OTHER PUBLICATIONS

Hamzaoglu, et al: "Split-Path Skewed (SPS) CMOS Buffer for High Performance and Low Power Applications," IEEE Transactions on Circuits and Sysetms—II: Analog and Digital Signal Processing, vol. 48, No. 10, Oct. 2001, pp. 998-1002.

Huang, et al.: "Feedback-controlled split-path CMOS buffer," 1996 IEEE International Symposium on Circuits and Systems (ISCAS), May 15, 1996, DOI: 10.1109/ISCAS.1996.541961, Atlanta, GA, USA, pp. 300-303.

Yoo: "A CMOS Buffer Without Short-Circuit Power Consumption," IEEE Transactions on Circuits and Systems—II: Analog and Digital Signal Processing, vol. 47, No. 9, Sep. 2000, pp. 935-937.

* cited by examiner

INTEGRATED CIRCUIT FOR CLOCK GENERATION

CROSS-REFERENCE TO RELATED APPLICATIONS

This application claims the priority under 35 U.S.C. § 119 of India application No. 202311033343, filed on 11 May 2023, the contents of which are incorporated by reference herein.

BACKGROUND

Field

This disclosure relates generally to integrated circuits, and more specifically, to clock generation.

Related Art

Many low power applications require an always ON clock source, which requires a clock generation circuit. Due to the importance of power consumption, the clock generation circuit should operate at low power, even if being supplied by high supply voltages. Typically, a clock generation circuit includes a comparator to convert the sinusoidal signal from a crystal oscillator to a rail-to rail clock signal, and then buffers the resulting signal to drive an output load. Overall power consumption by the clock generation circuit is determined by the power consumption by both the comparator and the buffers. The buffers typically consume dynamic power during each clock transition, in which faster input transitions are desired to result in lower power consumption by the buffers. However, the input transitions to the buffers are generated by the comparator, and the faster the output transitions from the comparator, the greater the power consumption required by the comparator. Therefore, a need exists for a clock generator circuit suitable for low power applications, with improved overall power consumption.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a clock generator circuit, which converts a sinusoidal signal to a stable rail-to-rail clock signal, includes a slew accelerator circuit coupled between a comparator circuit and a buffer stage circuit which operates to control transitions of the clock signal to improve the balance of power consumption between the comparator circuit and buffer stage circuit. This may allow for a clock generator circuit with reduced overall power consumption as compared to the comparator circuit directly providing its output to the buffer stage circuit. In one embodiment, the slew accelerator circuit overcomes the trade-off between comparator current and buffer current in order to reduce the overall current consumption of the clock generator circuit. As will be described in more detail below, the slew accelerator circuit itself is low power and produces sharp clock transitions to the buffer stage without increasing comparator current consumption. Also, in one embodiment, hysteresis is introduced to the comparator to improve operation in noisy environments.

Figure 1:
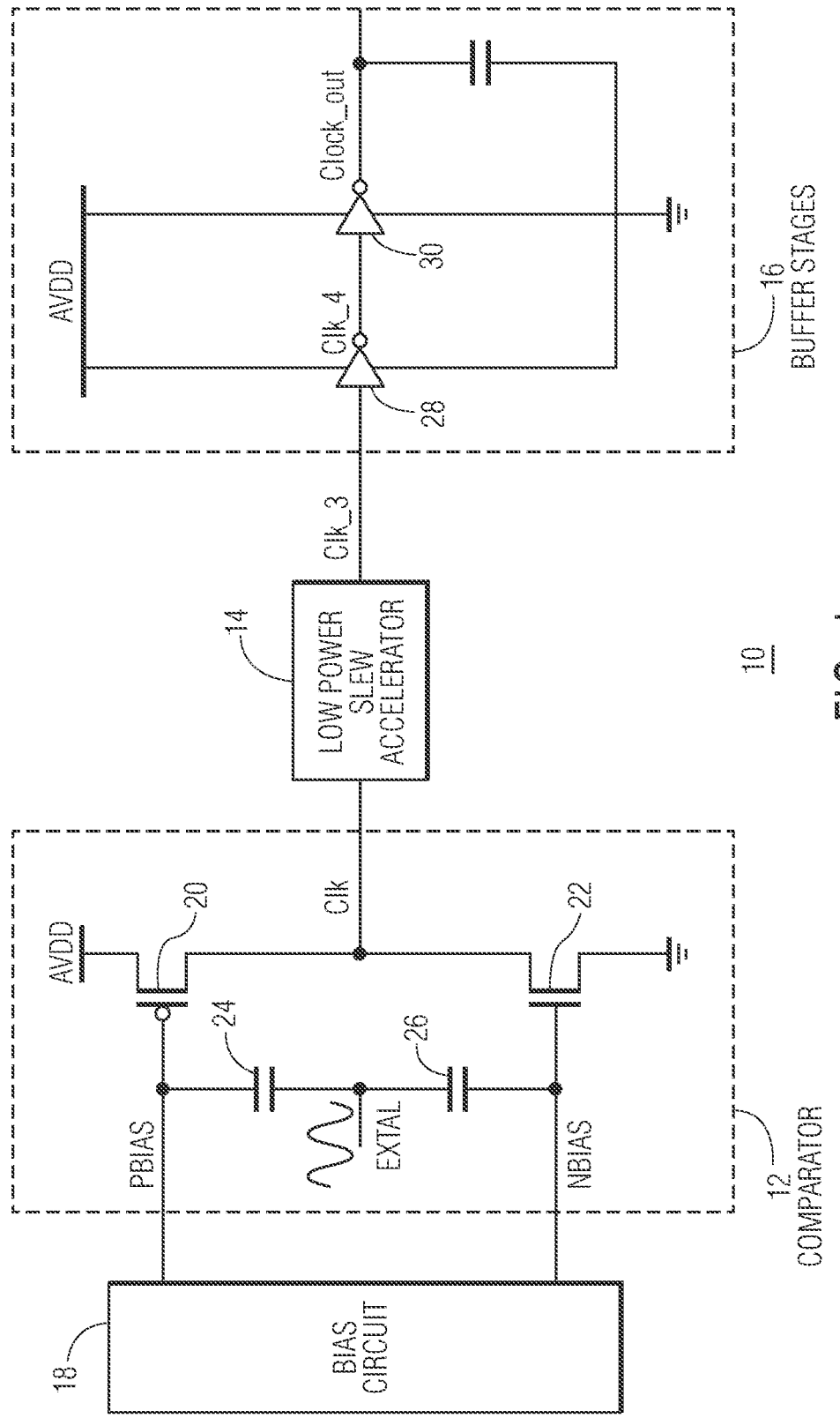
FIG. 1 illustrates, in partial schematic and partial block diagram form, a clock generator circuit having a slew accelerator circuit in accordance with one embodiment of the present invention.

FIG. 1 illustrates, in partial block diagram and partial schematic form, a clock generator circuit 10 having a comparator circuit 12, a slew accelerator circuit 14 (also referred to as a low power slew accelerator circuit, and buffer stages 16 (also referred to collectively as the buffer stage). In the illustrated embodiment, comparator 12 is implemented as a push-pull amplifier, including a PMOS transistor 20, an NMOS transistor 22, and capacitors 24 and 26. A bias circuit 18 can be included as part of comparator 12 or be located outside of comparator 12 to provide input bias voltages, PBIAS and NBIAS, to control electrodes of transistors 20 and 22, respectively. An input node of comparator 12, referred to as EXTAL, is coupled to receive a sinusoidal input signal, such as from a crystal oscillator. Capacitor 24 is coupled between the input node and the control electrode of transistor 20, and capacitor 26 is coupled between the input node and the control electrode of transistor 22.

A first current electrode of transistor 20 is coupled to a first voltage supply terminal (i.e. a first voltage rail) coupled to receive a first voltage supply, AVDD, and a second current electrode of transistor 20 is coupled to an output node of comparator 12 which provides a clock signal, Clk. A first current electrode of transistor 22 is coupled to the output node of comparator 12, and a second current electrode of transistor 22 is coupled to a second voltage supply terminal (i.e. a second voltage rail) coupled to receive a second voltage supply, GND, in which AVDD is greater than GND. In one embodiment, GND is 0V. Note that in the descriptions herein, the first and second voltage supply terminals can simply be referred to as AVDD and GND, respectively. Bias circuit 18 can be implemented in any known way, to produce PBIAS and NBIAS, as needed for comparator 12. In operation, comparator 12 converts the received sinusoidal signal at EXTAL to a rail-to-rail clock, e.g., Clk which transitions between AVDD and GND. The sharper the transitions, though, the more current (and thus power) is consumed. Note that in alternate embodiments, comparator 12 can be implemented with any type of circuitry which performs this conversion to produce Clk.

Clock generator circuit 10 also includes slew accelerator circuit 14 which receives Clk and provides a clock signal, Clk_3, at its output. Slew accelerator circuit 14 produces Clk_3 based on Clk, but with sharper clock transitions. Slew accelerator circuit 14 can do so without increasing comparator current consumption. Details of slew accelerator circuit 14 will be described in more detail below in reference to FIGS. 2 and 3.

Clock generator circuit 10 also includes buffer stages 16 to drive the output clock, Clock_out, at an output node of clock generator circuit 10. In the illustrated embodiment, buffer stages 16 is implemented as an inverter chain, including inverters 28 and 30. Inverter 28 has an input coupled to receive Clk_3 from slew accelerator 14, and provides an output, Clk_4 to an input of inverter 30. An output of inverter 30 corresponds to the output node of clock generator 10 and provides Clock_out. Each of inverters 28 and 30 are powered by AVDD and GND. The last inverter, inverter 30, drives the output load which is indicated by a capacitor as an output load capacitance. In the illustrated embodiment, the inverter chain (implemented with CMOS logic) consumes a dynamic current during the transitions of Clk_3. Therefore, the average current consumption of buffer stages 16 depends on the transition time of Clk_3 and its frequency. Note that in alternate embodiments, buffer stages 16 can be implemented with a different number of inverters or different circuitry which receives Clk_3 and drives Clock_out.

Figure 2:
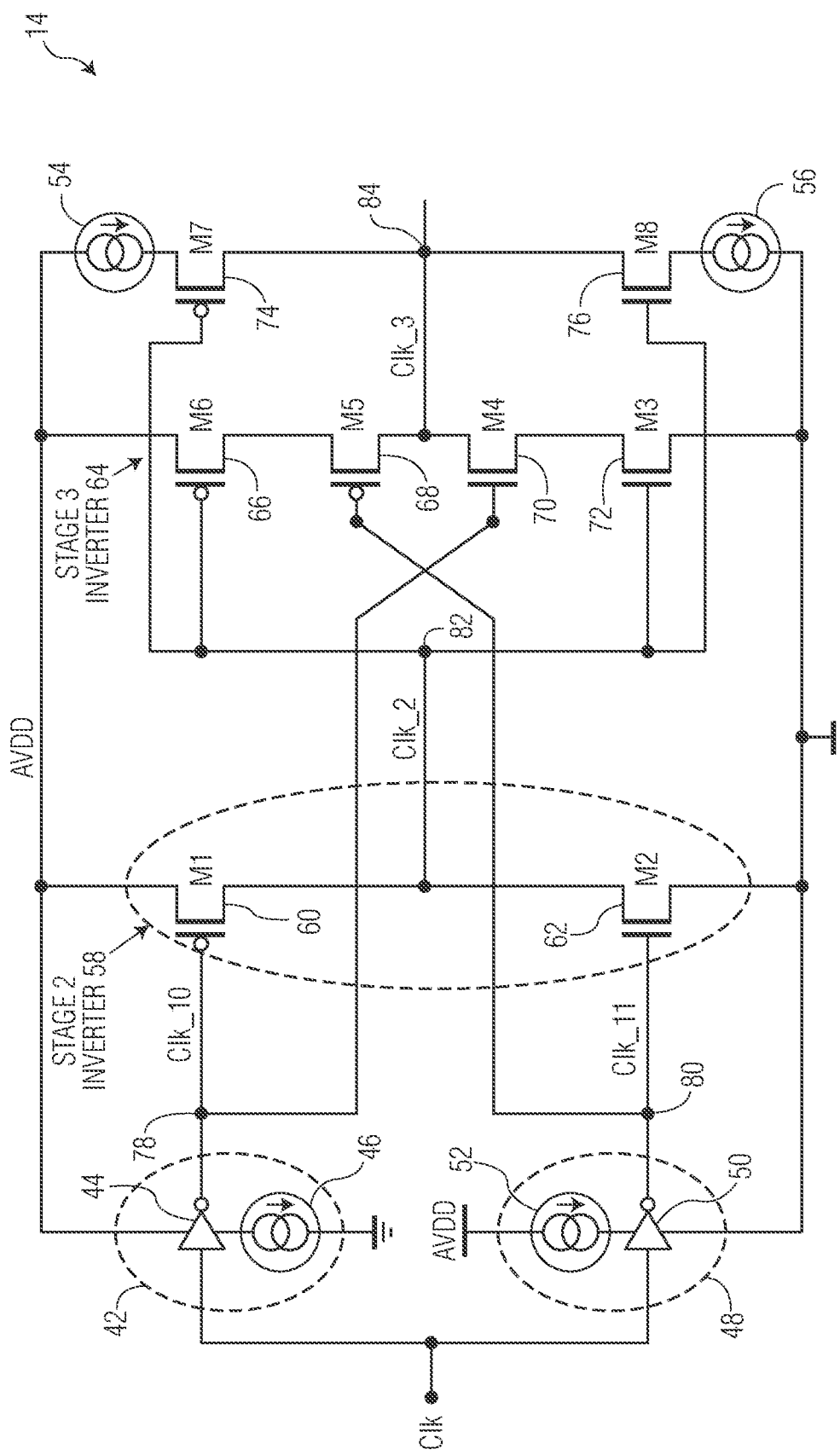
FIG. 2 illustrates, in schematic form, a more detailed version of the slew accelerator circuit of FIG. 1, in accordance with one embodiment of the present invention.

FIG. 2 illustrates, in schematic form, a more detailed representation of slew accelerator circuit 14 (also referred to as slew rate accelerator circuit or slew rate accelerator), in accordance with one embodiment of the present invention. Slew accelerator 14 includes current-controlled inverters 42 and 48, PMOS transistor M1 60, NMOS transistor M2 62, PMOS transistor M6 66, PMOS transistor M5 68, PMOS transistor M7 74, NMOS transistor M4 70, NMOS transistor M3 72, NMOS transistor M8 76, and current sources 54 and 56. For ease of description, each of transistors 60, 62, 72, 70, 68, 66, 74, and 76 will be referred to simply by their "M" number, M1-M8, respectively. Current-controlled inverter 42 (also referred to as inverter 42) includes an inverter 44 and a current source 46, and current-controlled inverter 48 (also referred to as inverter 48) includes an inverter 50 and a current source 52.

Inverter 44 has a first power terminal coupled to AVDD, and current source 46 is coupled between a second power terminal of inverter 44 and GND. An input of inverter 44 is coupled to an input of slew accelerator 14 to receive Clk. Current source 48 is coupled between AVDD and a first power terminal of inverter 50, and inverter 50 has a second power terminal coupled to GND. An input of inverter 50 is also coupled to the input of slew accelerator 14 to receive Clk. An output of inverter 44 is coupled to a circuit node 78 which provides a first clock signal, Clk_10, based on Clk, and an output of inverter 50 is coupled to a circuit node 80 which provides a second clock signal, Clk_11, based on Clk. Note that inputs of inverters 42 and 48 are also each coupled to receive Clk, an output of inverter 42 is coupled to node 78, and an output of inverter 48 is coupled to node 80. Inverters 42 and 48 may be referred to as a first inverter stage of slew accelerator 14.

Continuing with connectivity, a first current electrode of M1 is coupled to AVDD, a control electrode of M1 is coupled to node 78 to receive Clk_10, and a second current electrode of M1 is coupled to a circuit node 82 which provides a clock signal, Clk_2, based on both Clk10 and Clk_11. A first current electrode of M2 is coupled to node 82 and the second current electrode of M1, a control electrode of M2 is coupled to node 80 to receive Clk_11, and a second current electrode of M2 is coupled to GND. Transistors M1 and M2 may be collectively referred to as a second inverter stage 58 (i.e. Stage 2 Inverter), in which inverter stage 58 is coupled to receive Clk_10 and Clk_11 and provides Clk_2. Second inverter stage 58, as will be seen below, is used to make the rise/fall times of Clk_2 similar to each other and faster as compared to Clk.

A first current electrode of M6 is coupled to AVDD, and a control electrode of M6 is coupled to node 82 to receive Clk_2. A first current electrode of M5 is coupled to a second current electrode of M6, a control electrode of M5 is coupled to node 80 to receive Clk_11 (from the first inverter stage of slew accelerator 14), and a second current electrode of M5 is coupled to a circuit node 84 which provides a clock signal, Clk_3, based on Clk_10, Clk_11, and Clk_2. A first current electrode of M4 is coupled to node 84 and to the second current electrode of M5, and a control electrode of M4 is coupled to node 78 to receive Clk_10. A first current electrode of M3 is coupled to a second current electrode of M4, a control electrode of M3 is coupled to node 82 to receiver Clk_2, and a second current electrode of M3 is coupled to GND. Transistors M3, M4, M5, and M6 may be collectively referred to as a third inverter stage 64 (i.e. Stage 3 inverter). Third inverter stage 64, as will be seen below, is used to further accelerate the rise/fall times of Clk_3 as compared to Clk_2.

Current source 54 is coupled between AVDD and a first current electrode of M7, a control electrode of M7 is coupled to node 82 to receive Clk_2, and a second current electrode of M7 is coupled to node 84. A first current electrode of M8 is coupled to node 84, and a control electrode of M8 is coupled to node 82 to receive Clk_2. Current source 56 is coupled between a second current electrode of M8 and GND. Transistors M7 and M8, along with current sources 54 and 56, as will be seen below, operate as a parallel inverter to the third inverter stage and are used to maintain the static level of Clk_3.

Figure 3:
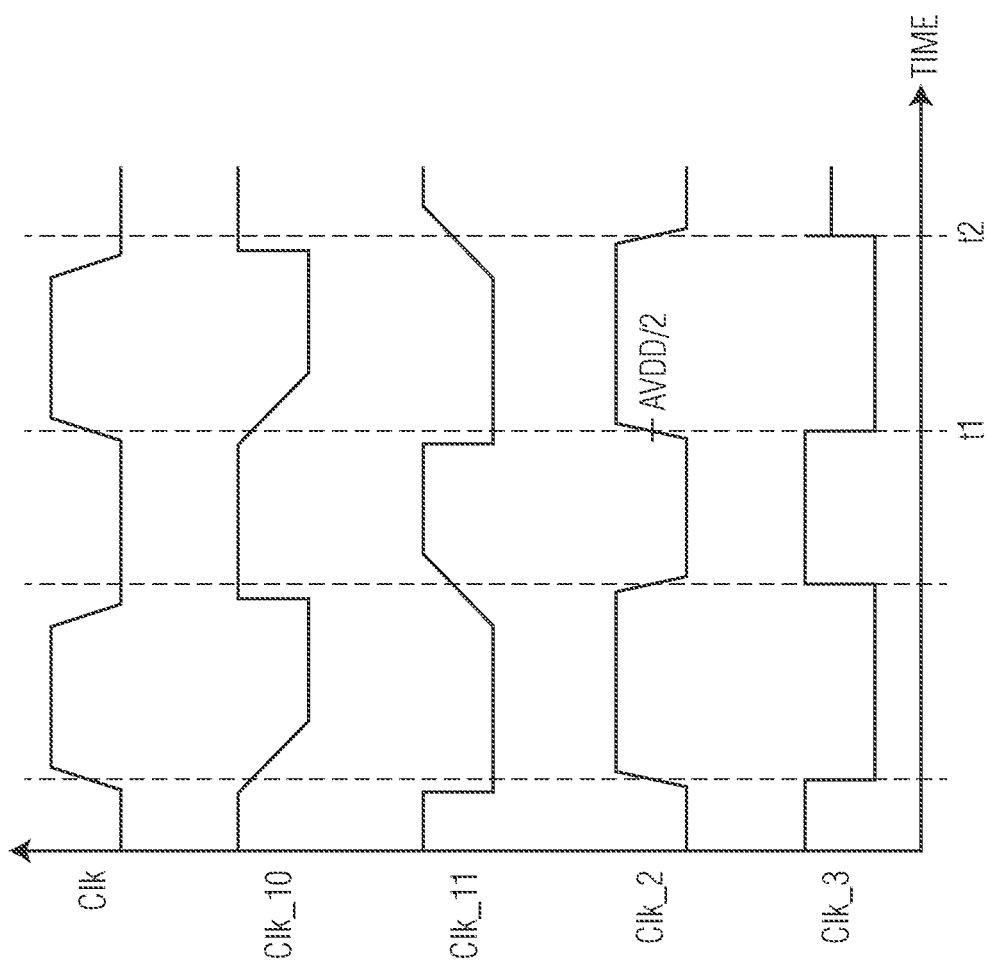
FIG. 3 illustrates various waveforms for signals within the clock generator circuit of FIG. 1, in accordance with one embodiment of the present invention.

FIG. 3 illustrates waveforms of various signals within slew accelerator 14 of FIG. 2, including Clk, Clk_10, Clk_11, Clk_2, and Clk_3, in accordance with one embodiment of the present invention. Operation of FIG. 2 will be described in reference to the waveforms of FIG. 3. As illustrated in FIG. 3, Clk represents the rail-to-rail clock signal generated by comparator 12 based on the input sinusoidal signal. The first inverter stage produces a pair of non-overlapping clocks, Clk_10 and Clk_11, each based on Clk, in which Clk_10 and Clk_11 transition opposite to Clk but with different rise and fall times with respect to each other. Therefore, as seen in FIG. 3 at time t1, with a rising edge of Clk, both Clk_10 and Clk_11 result in falling edges, and at time t2, with a falling edge of Clk, both Clk_10 and Clk_11 result in rising edges. However, the fall time of a falling edge of Clk_10 is slower as compared to the fall time of a falling edge of Clk_11, while the rise time of a rising edge of Clk_10 is faster as compared to the rise time of a rising edge of Clk_11, thus resulting in a pair of non-overlapping clocks. (As used herein, the fall time of a falling edge refers to the amount of time needed to complete a transition from a logic level high, i.e. logic level one, to a logic level low, i.e. logic level zero, and the rise time of a rising edge refers to the amount of time needed to complete a transition from a logic level low to a logic level high.)

Current controlled inverters 42 and 48 are used to generate the pair of non-overlapping clocks, such that the rise and fall times of Clk_10 as well as the rise and fall times of Clk_11 are not symmetric. For example, for clk_10, with current source 46 located between the second power terminal of inverter 44 and GND (such that inverter 44 is not directly connected to GND), the fall time of Clk_10 (e.g. of the falling edge at t1) at the output of inverter 44 is slower as compared to the rise time of Clk_10 (e.g. of the rising edge at t2). For clk_11, with current source 48 located between the first power terminal of inverter 50 and AVDD (such that inverter 50 is not directly connected to AVDD), the fall time of Clk_11 (e.g. at t1) at the output of inverter 50 is faster than the rise time of Clk_11 (e.g. at t2).

Therefore, as seen in FIG. 3, with the pair of non-overlapping clocks, the faster fall time of Clk_11 (as compared to the fall time of Clk_10) and the faster rise time of Clk_10 (as compared to the rise time of Clk_11) prevents a current from AVDD to GND through M1 and M2 because, as seen in FIG. 3, when Clk_10 is falling, M1 is partially turned on, but due to the quick fall time of Clk_11, M2 is more quickly turned off, limiting any short circuit current through M1 and M2. Similarly, when Clk_11 is rising, M2 is partially turned on, but due to the quick rise time of Clk_10, M1 is more quickly turned off, limiting the short circuit current at the rising and falling transitions of Clk. The second stage inverter 58 formed by M1 and M2 therefore generates Clk_2 at node 82, in which inverter 58 trips on the falling edges of Clk_10 and rising edges of Clk_11. As illustrated in FIG. 3, at t1, the falling edge of Clk_10 turns on M1 (while M2 is already off) which triggers a rising edge of Clk_2 (in which node 82 is pulled up to AVDD via M1), and, at t2, the rising edge of Clk_11 turns on M2 (while M1 is already off) which triggers a falling edge of Clk_2 (in which node 82 is pulled down to GND via M2). As a result, Clk_2 has shorter transitions as compared to Clk (e.g. steeper rise and fall times than Clk). However, for reduced power consumption in the buffer stages, the transition times need to be further reduced.

In third inverter stage 64, M3 and M6 are driven by Clk_2, M4 is driven by Clk_10, and M5 by Clk_11. This inverter configuration limits the current through M3-M6 from AVDD to GND during transitions. When Clk_2 switches from low to high (at time t1), Clk_11 is low and Clk_10 is ramping down to zero. When Clk_2 reaches AVDD/2, both M3 and M6 are partially on by AVDD/2, M5 is fully on, and M4 is partially on. In this manner, though, not all of transistors M3-M6 are fully on upon the rising edge transition of Clk_2, limiting the short-circuit current through third inverter stage 64. Similarly, when Clk_2 switches from high to low (at time t2), Clk_10 is high and Clk_11 is ramping up to AVDD. Again, when Clk_2 reaches VDD/2, both M3 and M6 are partially on, M4 is fully on, and M5 is partially on, limiting the short-circuit current through third inverter stage 64 upon the falling edge transition of Clk_2 as well.

Transistors M7 and M8 along with current sources 54 and 56 operate to maintain the static DC level of clk_3 since the transistors of third inverter stage 64 (M3-M6) are conducting only during transitions of Clk_2. Therefore, with Clk_2 driving the current electrodes of M7 and M8 and with current sources 54 and 56, Clk_3 is better able to achieve and hold a logic level high when Clk_2 is low, turning on M7 which pulls node 84 up to AVDD, and a logic level low when Clk_2 is high, turning on M8 which pulls node 84 down to GND. Note that while Clk_2 is low or high in steady state, M7 or M8, respectively, is on, but the combination of M3-M4 or the combination of M5-M6 is off. In this manner, the resulting output, Clk_3 at node 84 which is provided as the input to buffer stages 16 to drive Clock_out, includes sharp transitions and stable DC levels, in which Clk_3 has shorter transition times as compared to Clk_2 (e.g. steeper rise and fall times than Clk_2). This allows buffer stages 16 to achieve reduced power consumption as compared to providing Clk as the input to buffer stages 16 to drive Clock_out, without a slew accelerator.

Figure 4:
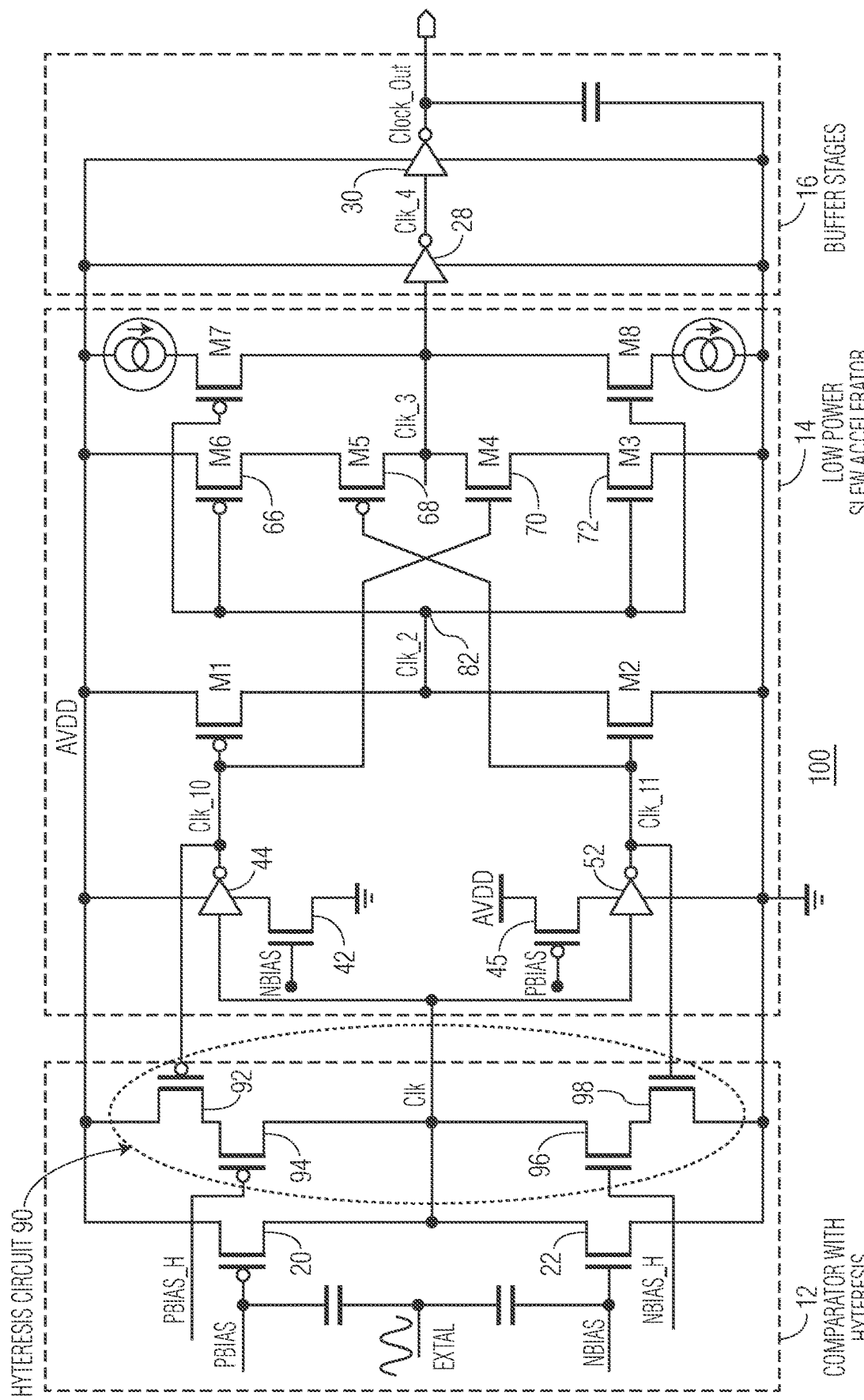
FIG. 4 illustrates, in schematic form, a clock generator circuit with a hysteresis circuit, in accordance with one embodiment of the present invention.

FIG. 4 illustrates, in schematic form, a clock generator circuit 100 which is similar to clock generator circuit 10, but with an additional hysteresis circuit 90 coupled to the output of comparator 12, in accordance with one embodiment of the present invention. Note that like references indicate like elements, therefore comparator 12 is similar to that illustrated in FIG. 1 which receives PBIAS and NBIAS and generates Clk. Slew accelerator 14 and buffer stages 16 are also similar to those illustrated in FIG. 1, in which slew accelerator 14 receives Clk as its input and generates Clk_10, Clk_11, Clk_2, and Clk_3, and buffer stages 16 receives Clk_3 and drives Clock_out. However, the output of comparator 12 is coupled to hysteresis circuit 90 which includes PMOS transistors 92 and 94 and NMOS transistors 96 and 98.

A first current electrode of transistor 92 is coupled to AVDD, and a control electrode of transistor 92 is coupled to receive Clk_10 (received as feedback from slew accelerator 14). A first current electrode of transistor 94 is coupled to a second current electrode of transistor 92, a control electrode of transistor 94 is coupled to receive a corresponding bias voltage, PBIAS_H, and a second current electrode of transistor 94 is coupled to the output node of comparator 12 (the second current electrode of transistor 20 and the first current electrode of transistor 22). A first current electrode of transistor 96 is coupled to the second current electrode of transistor 94 and the output node of comparator 12, and a control electrode is coupled to receive a corresponding bias voltage, NBIAS_H. A first current electrode of transistor 98 is coupled to a second current electrode of transistor 96, a control electrode of transistor 98 is coupled to receive Clk_11 (received as feedback from slew accelerator 14), and a second current electrode of transistor 98 is coupled to GND. Each of PBIAS_H and NBIAS_H received by hysteresis circuit 90 can be provided by the bias circuit which provides PBIAS and NBIAS, or by a separate bias circuit.

In operation, hysteresis circuit 90 uses the non-overlapping clocks generated by slew accelerator 14, Clk_10 and Clk_11, to control (i.e. drive) transistors 92 and 98. In this manner, transistors 92, 94, 96, and 98 will never be all on at the same time (because transistors 92 and 98 cannot be on at the same time with the non-overlapping clocks). In one embodiment, hysteresis circuit 90 introduces hysteresis of a percentage (e.g. +/−5%) of the input signal around the DC level of the comparator by using internal signals feedback from slew accelerator 14. Hysteresis for comparator 12 may help comparator 12 work better under noisy environments.

Therefore, by now it can be appreciated how the use of a slew accelerator may allow each of a comparator and buffer stages of a clock generator circuit to operate with reduced current (i.e. power) as compared to a clock generator circuit without a slew accelerator. In one embodiment, the slew accelerator is implemented with multiple inverter stages in which a first inverter stage generates non-overlapping clocks which allow a second inverter stage to produce a clock signal with faster transitions and a third inverter stage to produce a clock signal with even faster and sharper transitions as well as a stable DC level between transitions.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. The term "high" refers to a logic level high or logic level one, and "low" to a logic level low or logic level zero.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different sources other than a crystal may provide the sinusoidal signal. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, a clock generator includes a buffer stage configured to drive an output clock of the clock generator; and a slew accelerator circuit configured to receive a first clock signal and generate an input clock signal to the buffer stage, wherein the output clock of the clock generator is generated based on the input clock signal to the buffer stage. The slew accelerator circuit includes a first inverter stage configured to generate a pair of non-overlapping clock signals from the first clock signal, wherein a rise time of a first non-overlapping clock signal of the pair of non-overlapping clock signals is faster than a rise time of a second non-overlapping clock signal of the pair of non-overlapping clock signals, and a fall time of the second non-overlapping clock signal is faster than a fall time of the first non-overlapping clock signal; a second inverter stage configured to generate a first intermediate clock signal based on the pair of non-overlapping clock signals; and a third inverter stage configured to generate the input clock signal to the buffer stage based on the first intermediate clock signal and the pair of non-overlapping clock signals. In one aspect of the embodiment, the first inverter stage includes a first current controlled inverter configured to receive the first clock signal and generate the first non-overlapping clock signal, and a second current controlled inverter configured to receive the first clock signal and generate the second non-overlapping clock signal. In a further aspect, the first current controlled inverter includes a first inverter and a first current source between the first inverter and a first voltage rail of the clock generator, and the second current controlled inverter includes a second inverter and a second current source between the second inventor and a second voltage rail of the clock generator, different form the first voltage rail. In another aspect of the embodiment, the clock generator further includes a comparator configured to convert an incoming sinusoidal wave to the first clock signal, wherein the first clock signal is a rail-to-rail clock signal. In another aspect, the second inverter stage includes a first transistor having a first current electrode coupled to a first voltage rail, a second current electrode coupled to an intermediate node which provides the first intermediate clock signal, and a control electrode coupled to receive the first non-overlapping clock signal; and a second transistor having a first current electrode coupled to the intermediate node, a second current electrode coupled to a second voltage rail, different from the first voltage rail, and a control electrode coupled to receive the second non-overlapping clock signal, wherein the first voltage rail is configured to provide a first supply voltage and the second voltage rail is configured to provide a second supply voltage, less than the first supply voltage. In a further aspect, the third inverter stage includes a third transistor having a first current electrode coupled to the first voltage rail, a control electrode coupled to the intermediate node to receive the first intermediate clock signal, and a second current electrode coupled to an output node which provides the input clock signal to the buffer stage; and a fourth transistor having a first current electrode coupled to the output node, a control electrode coupled to the intermediate node to receive the first intermediate clock signal, and a second current electrode coupled to the second voltage rail. In yet a further aspect, the third inverter stage further includes a fifth transistor having a first current electrode coupled to the first voltage rail, a control electrode coupled to receive the second non-overlapping clock signal, and a second current electrode coupled to the output node; and a sixth transistor having a first current electrode coupled to the output node, a control electrode coupled to receive the first non-overlapping clock signal, and a second current electrode coupled to the second voltage rail. In yet an even further aspect, the third transistor is coupled between the first voltage rail and the fifth transistor, and the fourth transistor is coupled between the sixth transistor and the second voltage rail. In another yet even further aspect, the clock generator further includes a seventh transistor having a first current electrode coupled to the first voltage rail, a control electrode coupled to the intermediate node to receive the first intermediate clock signal, and a second current electrode coupled to the output node; an eighth transistor having a first current electrode coupled to the output node, a control electrode coupled to the intermediate node to receive the first intermediate clock signal, and a second current electrode coupled to the second voltage rail; a first current source coupled between the first current electrode of the seventh transistor and the first voltage rail; and a second current source coupled between the second current electrode of the eighth transistor and the second voltage rail. In another further aspect, the third inverter stage further includes a third transistor having a first current electrode coupled to the first voltage rail, a control electrode coupled to receive the second non-overlapping clock signal, and a second current electrode coupled to an output node which provides the input clock signal to the buffer stage; and a fourth transistor having a first current electrode coupled to the output node, a control electrode coupled to receive the first non-overlapping clock signal, and a second current electrode coupled to the second voltage rail. In another aspect of the embodiment, the clock generator further includes a comparator coupled to convert an input sinusoidal signal to the first clock signal, wherein the first clock signal is provided at an output node of the comparator; and a hysteresis circuit coupled to the output node of the comparator and coupled to receive the pair of non-overlapping clock signals, wherein the hysteresis circuit is configured to provide hysteresis to the first clock signal in response to the pair of non-overlapping clock signals. In a further aspect, the hysteresis circuit includes a first transistor having a first current electrode coupled to the first voltage rail, a control electrode coupled to receive the first non-overlapping clock signal, and a second current electrode coupled to the output node of the comparator; and a second transistor having a first current electrode coupled to the output node of the comparator, a control electrode coupled to receive the second non-overlapping clock signal, and a second current electrode coupled to the second voltage rail. In yet a further aspect, the hysteresis circuit further includes a third transistor coupled between the first transistor and the output node of the comparator and having a control electrode coupled to receive a first bias voltage, and a fourth transistor coupled between the output node of the comparator and the second transistor and having a control electrode coupled to receive a second bias voltage.

In another embodiment, a clock generator has a first voltage supply terminal configured to provide a first supply voltage and a second voltage supply terminal configured to provide a second supply voltage, wherein the first supply voltage is greater than the second supply voltage. The clock generator includes a buffer stage configured to drive an output clock of the clock generator; and a slew accelerator circuit configured to receive a first clock signal and generate an input clock signal to the buffer stage, wherein the output clock of the clock generator is generated based on the input clock signal to the buffer stage. The slew accelerator circuit includes a first current controlled inverter configured to receive the first clock signal and generate a first intermediate clock signal; a second current controlled inverter configured to receive the first clock signal and generate a second intermediate clock signal, wherein rise times of the first and second intermediate clock signals differ and fall times of the first and second intermediate clock signals differ; a first transistor having a first current electrode coupled to the first voltage supply terminal, a second current electrode coupled to an intermediate node which provides a third intermediate clock signal, and a control electrode coupled to receive the first intermediate clock signal; a second transistor having a first current electrode coupled to the intermediate node, a second current electrode coupled to a second voltage supply terminal, and a control electrode coupled to receive the second intermediate clock signal; and an inverter stage configured to generate the input clock signal to the buffer stage based on the first, second, and third intermediate clock signals. In one aspect of the another embodiment, a rise time of the first intermediate clock signal is faster than a rise time of the second intermediate clock signal, and a fall time of the second intermediate clock signal is faster than a fall time of the first intermediate clock signal. In another aspect, the inverter stage includes a third transistor having a first current electrode coupled to the first voltage supply terminal, a control electrode coupled to receive the third intermediate clock signal, and a second current electrode; a fourth transistor having a first current electrode, a control electrode coupled to receive the third intermediate clock signal, and a second current electrode coupled to the second voltage supply terminal; a fifth transistor having a first current electrode coupled to the second current electrode of the third transistor, a control electrode coupled to receive the second intermediate clock signal, and a second current electrode coupled to an output node which provides the input clock signal to the buffer stage; and a sixth transistor having a first current electrode coupled to the output node, a control electrode coupled to receive the first intermediate clock signal, and a second current electrode coupled to the first current electrode of the fourth transistor. In a further aspect, the clock generator further includes a seventh transistor having a first current electrode coupled to the first voltage supply terminal, a control electrode coupled to receive the third intermediate clock signal, and a second current electrode coupled to the output node; an eighth transistor having a first current electrode coupled to the output node, a control electrode coupled to receive the third intermediate clock signal, and a second current electrode coupled to the second voltage supply terminal; a first current source coupled between the first voltage supply terminal and the first current electrode of the seventh transistor; and a second current source coupled between the second current electrode of the eighth transistor and the second voltage supply terminal.

In yet another embodiment, a clock generator includes a buffer stage configured to drive an output clock of the clock generator; a slew accelerator circuit configured to receive a first clock signal and generate an input clock signal to the buffer stage, wherein the output clock of the clock generator is generated based on the input clock signal to the buffer stage; a comparator, and a hysteresis circuit. The slew accelerator circuit includes a first inverter stage configured to generate a pair of non-overlapping clock signals from the first clock signal, wherein a rise time of a first non-overlapping clock signal of the pair of non-overlapping clock signals is faster than a rise time of a second non-overlapping clock signal of the pair of non-overlapping clock signals, and a fall time of the second non-overlapping clock signal is faster than a fall time of the first non-overlapping clock signal; a second inverter stage configured to generate a first intermediate clock signal based on the pair of non-overlapping clock signals; and a third inverter stage configured to generate the input clock signal to the buffer stage based on the first intermediate clock signal and the pair of non-overlapping clock signals. The comparator is coupled to convert an input sinusoidal signal to the first clock signal, wherein the first clock signal is a rail-to-rail clock signal provided at an output node of the comparator; and the hysteresis circuit is coupled to the output node of the comparator and coupled to receive the pair of non-overlapping clock signals. In one aspect of the yet another embodiment, the hysteresis circuit includes a first transistor having a first current electrode coupled to the first voltage rail, a control electrode coupled to receive the first non-overlapping clock signal, and a second current electrode coupled to the output node of the comparator; and a second transistor having a first current electrode coupled to the output node of the comparator, a control electrode coupled to receive the second non-overlapping clock signal, and a second current electrode coupled to the second voltage rail. In a further aspect, the hysteresis circuit further includes a third transistor coupled between the first transistor and the output node of the comparator and having a control electrode coupled to receive a first bias voltage, and a fourth transistor coupled between the output node of the comparator and the second transistor and having a control electrode coupled to receive a second bias voltage.

The invention claimed is:

1. A clock generator comprising:
a buffer stage configured to drive an output clock of the clock generator; and
a slew accelerator circuit configured to receive a first clock signal and generate an input clock signal to the buffer stage, wherein the output clock of the clock generator is generated based on the input clock signal to the buffer stage, the slew accelerator circuit comprising:
  a first inverter stage configured to generate a pair of non-overlapping clock signals from the first clock signal, wherein a rise time of a first non-overlapping clock signal of the pair of non-overlapping clock signals is faster than a rise time of a second non-overlapping clock signal of the pair of non-overlapping clock signals, and a fall time of the second non-overlapping clock signal is faster than a fall time of the first non-overlapping clock signal;
  a second inverter stage configured to generate a first intermediate clock signal based on the pair of non-overlapping clock signals; and
  a third inverter stage configured to generate the input clock signal to the buffer stage based on the first intermediate clock signal and the pair of non-overlapping clock signals.

2. The clock generator of claim 1, wherein the first inverter stage comprises:
a first current controlled inverter configured to receive the first clock signal and generate the first non-overlapping clock signal, and
a second current controlled inverter configured to receive the first clock signal and generate the second non-overlapping clock signal.

3. The clock generator of claim 2, wherein:
the first current controlled inverter comprises a first inverter and a first current source between the first inverter and a first voltage rail of the clock generator, and
the second current controlled inverter comprises a second inverter and a second current source between the second inventor and a second voltage rail of the clock generator, different form the first voltage rail.

4. The clock generator of claim 1, further comprising:
a comparator configured to convert an incoming sinusoidal wave to the first clock signal, wherein the first clock signal is a rail-to-rail clock signal.

5. The clock generator of claim 1, wherein the second inverter stage comprises:
a first transistor having a first current electrode coupled to a first voltage rail, a second current electrode coupled to an intermediate node which provides the first intermediate clock signal, and a control electrode coupled to receive the first non-overlapping clock signal; and
a second transistor having a first current electrode coupled to the intermediate node, a second current electrode coupled to a second voltage rail, different from the first voltage rail, and a control electrode coupled to receive the second non-overlapping clock signal, wherein the first voltage rail is configured to provide a first supply voltage and the second voltage rail is configured to provide a second supply voltage, less than the first supply voltage.

6. The clock generator of claim 5, wherein the third inverter stage comprises:
a third transistor having a first current electrode coupled to the first voltage rail, a control electrode coupled to the intermediate node to receive the first intermediate clock signal, and a second current electrode coupled to an output node which provides the input clock signal to the buffer stage; and
a fourth transistor having a first current electrode coupled to the output node, a control electrode coupled to the intermediate node to receive the first intermediate clock signal, and a second current electrode coupled to the second voltage rail.

7. The clock generator of claim 6, wherein the third inverter stage further comprises:
a fifth transistor having a first current electrode coupled to the first voltage rail, a control electrode coupled to receive the second non-overlapping clock signal, and a second current electrode coupled to the output node; and
a sixth transistor having a first current electrode coupled to the output node, a control electrode coupled to receive the first non-overlapping clock signal, and a second current electrode coupled to the second voltage rail.

8. The clock generator of claim 7, wherein the third transistor is coupled between the first voltage rail and the fifth transistor, and the fourth transistor is coupled between the sixth transistor and the second voltage rail.

9. The clock generator of claim 7, further comprising:
a seventh transistor having a first current electrode coupled to the first voltage rail, a control electrode coupled to the intermediate node to receive the first intermediate clock signal, and a second current electrode coupled to the output node;

an eighth transistor having a first current electrode coupled to the output node, a control electrode coupled to the intermediate node to receive the first intermediate clock signal, and a second current electrode coupled to the second voltage rail;

a first current source coupled between the first current electrode of the seventh transistor and the first voltage rail; and a second current source coupled between the second current electrode of the eighth transistor and the second voltage rail.

10. The clock generator of claim 5, wherein the third inverter stage further comprises:

a third transistor having a first current electrode coupled to the first voltage rail, a control electrode coupled to receive the second non-overlapping clock signal, and a second current electrode coupled to an output node which provides the input clock signal to the buffer stage; and a fourth transistor having a first current electrode coupled to the output node, a control electrode coupled to receive the first non-overlapping clock signal, and a second current electrode coupled to the second voltage rail.

11. The clock generator of claim 1, further comprising:

a comparator coupled to convert an input sinusoidal signal to the first clock signal, wherein the first clock signal is provided at an output node of the comparator; and a hysteresis circuit coupled to the output node of the comparator and coupled to receive the pair of non-overlapping clock signals, wherein the hysteresis circuit is configured to provide hysteresis to the first clock signal in response to the pair of non-overlapping clock signals.

12. The clock generator of claim 11, wherein the hysteresis circuit comprises:

a first transistor having a first current electrode coupled to the first voltage rail, a control electrode coupled to receive the first non-overlapping clock signal, and a second current electrode coupled to the output node of the comparator; and a second transistor having a first current electrode coupled to the output node of the comparator, a control electrode coupled to receive the second non-overlapping clock signal, and a second current electrode coupled to the second voltage rail.

13. The clock generator of claim 12, wherein the hysteresis circuit further comprises:

a third transistor coupled between the first transistor and the output node of the comparator and having a control electrode coupled to receive a first bias voltage, and a fourth transistor coupled between the output node of the comparator and the second transistor and having a control electrode coupled to receive a second bias voltage.

14. A clock generator having a first voltage supply terminal configured to provide a first supply voltage and a second voltage supply terminal configured to provide a second supply voltage, wherein the first supply voltage is greater than the second supply voltage, the clock generator comprising:

a buffer stage configured to drive an output clock of the clock generator; and a slew accelerator circuit configured to receive a first clock signal and generate an input clock signal to the buffer stage, wherein the output clock of the clock generator is generated based on the input clock signal to the buffer stage, the slew accelerator circuit comprising:

a first current controlled inverter configured to receive the first clock signal and generate a first intermediate clock signal;

a second current controlled inverter configured to receive the first clock signal and generate a second intermediate clock signal, wherein rise times of the first and second intermediate clock signals differ and fall times of the first and second intermediate clock signals differ;

a first transistor having a first current electrode coupled to the first voltage supply terminal, a second current electrode coupled to an intermediate node which provides a third intermediate clock signal, and a control electrode coupled to receive the first intermediate clock signal;

a second transistor having a first current electrode coupled to the intermediate node, a second current electrode coupled to a second voltage supply terminal, and a control electrode coupled to receive the second intermediate clock signal; and an inverter stage configured to generate the input clock signal to the buffer stage based on the first, second, and third intermediate clock signals.

15. The clock generator of claim 14, wherein a rise time of the first intermediate clock signal is faster than a rise time of the second intermediate clock signal, and a fall time of the second intermediate clock signal is faster than a fall time of the first intermediate clock signal.

16. The clock generator of claim 14, wherein the inverter stage comprises:

a third transistor having a first current electrode coupled to the first voltage supply terminal, a control electrode coupled to receive the third intermediate clock signal, and a second current electrode;

a fourth transistor having a first current electrode, a control electrode coupled to receive the third intermediate clock signal, and a second current electrode coupled to the second voltage supply terminal;

a fifth transistor having a first current electrode coupled to the second current electrode of the third transistor, a control electrode coupled to receive the second intermediate clock signal, and a second current electrode coupled to an output node which provides the input clock signal to the buffer stage; and a sixth transistor having a first current electrode coupled to the output node, a control electrode coupled to receive the first intermediate clock signal, and a second current electrode coupled to the first current electrode of the fourth transistor.

17. The clock generator of claim 16, further comprising:

a seventh transistor having a first current electrode coupled to the first voltage supply terminal, a control electrode coupled to receive the third intermediate clock signal, and a second current electrode coupled to the output node;

an eighth transistor having a first current electrode coupled to the output node, a control electrode coupled to receive the third intermediate clock signal, and a second current electrode coupled to the second voltage supply terminal;

a first current source coupled between the first voltage supply terminal and the first current electrode of the seventh transistor; and
a second current source coupled between the second current electrode of the eighth transistor and the second voltage supply terminal.

18. A clock generator comprising:
a buffer stage configured to drive an output clock of the clock generator;
a slew accelerator circuit configured to receive a first clock signal and generate an input clock signal to the buffer stage, wherein the output clock of the clock generator is generated based on the input clock signal to the buffer stage, the slew accelerator circuit comprising:
  a first inverter stage configured to generate a pair of non-overlapping clock signals from the first clock signal, wherein a rise time of a first non-overlapping clock signal of the pair of non-overlapping clock signals is faster than a rise time of a second non-overlapping clock signal of the pair of non-overlapping clock signals, and a fall time of the second non-overlapping clock signal is faster than a fall time of the first non-overlapping clock signal;
  a second inverter stage configured to generate a first intermediate clock signal based on the pair of non-overlapping clock signals; and
  a third inverter stage configured to generate the input clock signal to the buffer stage based on the first intermediate clock signal and the pair of non-overlapping clock signals;

a comparator coupled to convert an input sinusoidal signal to the first clock signal, wherein the first clock signal is a rail-to-rail clock signal provided at an output node of the comparator; and
a hysteresis circuit coupled to the output node of the comparator and coupled to receive the pair of non-overlapping clock signals.

19. The clock generator of claim 18, wherein the hysteresis circuit comprises:
a first transistor having a first current electrode coupled to the first voltage rail, a control electrode coupled to receive the first non-overlapping clock signal, and a second current electrode coupled to the output node of the comparator; and
a second transistor having a first current electrode coupled to the output node of the comparator, a control electrode coupled to receive the second non-overlapping clock signal, and a second current electrode coupled to the second voltage rail.

20. The clock generator of claim 19, wherein the hysteresis circuit further comprises:
a third transistor coupled between the first transistor and the output node of the comparator and having a control electrode coupled to receive a first bias voltage, and
a fourth transistor coupled between the output node of the comparator and the second transistor and having a control electrode coupled to receive a second bias voltage.

* * * * *